United States Patent [19]
Fujisaki

[11] Patent Number: 5,481,671
[45] Date of Patent: Jan. 2, 1996

[54] MEMORY TESTING DEVICE FOR MULTIPORTED DRAMS

[75] Inventor: Kenichi Fujisaki, Gyoda, Japan

[73] Assignee: Advantest Corporation, Tokyo, Japan

[21] Appl. No.: 122,490

[22] PCT Filed: Feb. 2, 1993

[86] PCT No.: PCT/JP93/00118

§ 371 Date: Dec. 30, 1993

§ 102(e) Date: Dec. 30, 1993

[87] PCT Pub. No.: WO93/15462

PCT Pub. Date: Aug. 5, 1993

[30] Foreign Application Priority Data

Feb. 3, 1992 [JP] Japan ................................ 4-017758

[51] Int. Cl.⁶ ............................ G11C 29/00; G11C 7/00
[52] U.S. Cl. ............................... 395/182.06; 365/201
[58] Field of Search ........................ 371/21.1, 21.2,
371/21.6, 15.1, 29.1; 395/575, 182.06;
324/266.4; 365/201

[56] References Cited

U.S. PATENT DOCUMENTS

| | | | |
|---|---|---|---|
| 4,414,665 | 11/1983 | Kimura et al. | 371/21 |
| 4,736,373 | 4/1988 | Schmidt | 371/10 |
| 5,062,109 | 10/1991 | Ohsima et al. | 371/21.2 |
| 5,263,029 | 11/1993 | Wicklund, Jr. | 371/21.1 |

FOREIGN PATENT DOCUMENTS

| | | |
|---|---|---|
| 61-147356 | 7/1986 | Japan . |
| 62-271291 | 11/1987 | Japan . |
| 3-296843 | 12/1991 | Japan . |
| 4-132095 | 5/1992 | Japan . |

*Primary Examiner*—Robert W. Beausoliel, Jr.
*Assistant Examiner*—Norman M. Wright
*Attorney, Agent, or Firm*—Staas & Halsey

[57] ABSTRACT

A failure analysis memory (7) having main and sub failure analysis memories (7a, 7b) has two counters (C1, C2), a multiplexer (MUX), two registers (RG1, RG2) and a comparator 14. A value corresponding to the size of a column address of a memory under test (2) is set in the register (RG1) and a stop address is set in the register (RG2). Each time a SAM part (2b) of the memory under test sequentially outputs data in an address area specified by a transfer row address and a start address, one of the counters is incremented on a one-by-one basis from a start address set therein, and its count value is selected by the multiplexer (MUX) and output as a sub address signal (SA'). During this time, the other counter in the non-counting state loads therein a main address specifying data that a RAM part 2a transfers next. When the memory under test operates in a simple read/transfer mode or a split read/transfer mode, a column address in the output from the multiplexer (MUX) is compared by the comparator (14) with the value set in the register (RG1). When the memory under test operates in a stop control split read/transfer mode the column address is compared with the value set in the register (RG2). When coincidence is detected by the comparator (14), a controller (12) switches the counting and non-counting states of the counters (C1, C2).

6 Claims, 8 Drawing Sheets

MEMORY TESTING DEVICE FOR MULTIPORTED DRAMS

FIELD OF THE INVENTION

The present invention relates to a memory testing deivce and, more particularly, to a memory testing device for performing a read/transfer function test of a memory device having a random access memory (RAM) part and a serial or sequential access (SAM) part, the memory device commonly referred to as a multi-port DRAM or dual port video RAM. This read/transfer function test of the memory device is such that all data stored at addresses of one row address of a RAM part of a memory device under test are transferred from the RAM part to a SAM part at one time, reads out therefrom the transferred data in the SAM part are sequentially read out of the SAM part and are sequentially compared with an expected value. In such a read/transfer function test of a memory device such as a multi-part DRAM or dual port video RAM, in accordance with the present invention, when a failure occurs, data indicating the failure is written into a sub failure analysis memory at the same address as that in the RAM part where the failure bit was stored.

BACKGROUND OF THE INVENTION

A conventional memory testing device will be described with reference to FIGS. 4 through 7. A multi-port DRAM 2, which is a memory under test (hereinafter referred to as MUT), has a RAM part 2a and a SAM part 2b as shown in FIG. 4. The RAM part 2a has an address input terminal A, a control signal input terminal CT and a data I/O terminal D, whereas the SAM part 2b has a clock terminal CLK and a data I/O terminal D. Assuming, for the sake of simplicity, that the RAM part 2a has, for instance, 0 to 255 row addresses and 0 to 255 column addresses, that is, that M=N=255 in FIG. 4, a row address signal and a column address signal each have an 8-bit configuration.

(a) Test of RAM part

Timing signals, which are fed from main and sub timing generating parts 3a and 3b which form a timing generator 3, are supplied to main and sub pattern generating parts 4a and 4b which form a pattern generator 4. In synchronization with the input timing signal thereto, the main pattern generating part 4a responds to an instruction from an instruction memory, not shown, to generate and apply a control signal, a test pattern TP and an address signal MA for writing the test pattern to the RAM part 2a of the MUT 2. The address signal MA is fetched, as sets of row and column addresses (hereinafter referred to also as a main address), into the RAM part 2a and pattern data is written into or read out from memory cells selected by the main address. In general, a plurality of memory cells are provided at each address so that data of plural bits can be stored as one word, but one memory cell may also be provided. The data read out of the RAM part 2a is input into a main logical comparison part 6a, wherein it is compared with an expected pattern EP that is provided from the main pattern generating part 4a. Upon detecting a disagreement at any bit in the word read out from a certain address, a main failure signal MF="1" is immediately generated and fed to a main failure analysis memory 7a. The main failure analysis memory 7a has the same storage space as that of the RAM part 2a and is supplied at its address input terminal A with the same version as the main address signal MA that is applied to the RAM par 2a; hence, the main failure signal MF="1" is written into the memory 7a at the same address as that (a set of row and column addresses concerned) in the RAM part 2a where the word-containing the failure bit in the output from the SAM part 2b had been stored before it was transferred.

Thereafter, test patterns are sequentially written into the RAM part 2a at its all addresses and the same test as mentioned above is repeated; upon each occurrence of a failure bit, the main failure signal MF="1" is written into the main failure analysis memory 7a.

(b) Read/Transfer Test

A row address (hereinafter referred to as a transfer row address) of the RAM part 2a from which pieces of data are to be transferred to the SAM part 2b at one time is provided from the main pattern generating part 4a to the RAM part 2a; at the same time, a column address (hereinafter referred to as a SAM start address) that indicates the column address of the data transferred to the SAM part 2b at which serial read of the data is to start is provided to the SAM part 2b from the main pattern generating part 4a via the RAM part 2a. As shown in FIG. 6, the entire data at a row address transferred to the SAM part 2b is serially read out, starting at the specified column address (a SAM start address), and output on a word-by-word basis and input into a sub logical comparison part 6b for comparison with an expectation pattern input thereinto from the sub pattern generating part 4b. When a disagreement is detected between an arbitrary bit in the read-out word and the expected pattern, a sub failure signal SF="1" (SF="0" in the case of coincidence being detected) is immediately generated and input into a sub failure analysis memory 7b. The sub failure analysis memory 7b has the same storage capacity as that of the RAM part 2a. A sub address signal SA, which indicates the address (a set of row and column addresses) in the RAM part 2a where the data output from the SAM part 2b was stored prior to its transfer, is applied from the sub pattern generating part 4b to the sub failure analysis memory 7b, and the sub failure signal SF=1 is written into all memory cells at that address.

A program for generating from the sub pattern generating part 4b the sub address signal SA which is provided to the sub failure analysis memory 7b in the above read/transfer test is produced taking into account the address in the RAM part 2a where the data being read out of the SAM part 2b was stored. In this instance, the program must be generated taking into consideration of the main address signal MA (composed of the transfer row address and the SAM start address) from the main pattern generating part 4a—this poses a problem that the work-load for the generation of the program and its debug increases.

Incidentally, some of the latest multi-port DRAM's possess a split read/transfer function such that as shown in FIG. 7A, in the case of data transfer from the RAM part 2a to the SAM part 2b, the column address area of the SAM part 2b is divided at its center into two address areas (0 through 127 and 128 through 255, for instance), i.e. a lower address area SAM2b-L and an upper address area SAM2b-U and while one of them sequentially outputs pieces of data already transferred thereto from the corresponding column address area at transfer row addresses in the RAM part 2a, the other column address area receives data being transferred from the corresponding column address area at the transfer row addresses in the RAM part 2a, the two column address area alternating these operations. (The SAM during data output is called an active SAM and the other non-active SAM.) In this instance, start addresses S1 and S2 that are provided to the lower column address area SAM2b-L and the upper address area SAM2b-U are supplied to the SAM part 2b from the main pattern generating part 4a via the RAM part 2a. The pieces of data transferred to the lower address area SAM2b-L are sequentially read out from the start address S1 to a lower-side maximum address AMI (=127) as indicated by the arrow in FIG. 7B, and in this white data is transferred from the RAM part 2a to the upper address area SAM2b-U. Next, the data thus transferred to the upper address area SAM2b-U is read out from the start address S2 to an upper-side maximum address AM 2 (=255) in such an order as indicated by the arrow in FIG. 7B.

Furthermore, some of the latest multi-port DRAM's have also a stop register control function that controls the split read/transfer by switching switches the destinationof data between the lower and upper address areas SAM2bL and SAM2b-U according to a set value (a stop address) in a built-in stop register (FIG. 7C). From the technical as well as work-load standpoints, it has become more and more difficult to program the sub address signal SA that is applied from the sub pattern generating part 4b to the sub failure analysis memory 7b, in combination with such a complex split read/transfer operation in these latest multi-port DRAM's.

It is therefore an object of the present invention to solve the problem of the prior art by a novel implementation of a sub address generator that is able to generate the sub address signal SA by hardware, not by software as in the prior art.

SUMMARY OF THE INVENTION

The present invention is directed to a memory testing device wherein a timing signal is applied from timing generating means to main and sub pattern generating parts; a test pattern, a control signal and a main address signal are applied from the main pattern generating part to a random access memory (RAM) part of a memory under test having the RAM part and a serial or sequential access memory (SAM) part; a test pattern and a clock signal are applied from the sub pattern generating part to the SAM part; the test pattern read out of the RAM part and an expected pattern supplied from the main pattern generating part are compared with each other in a main logical comparison part and the test pattern read out of the SAM part and an unexpected pattern supplied from the sub pattern generating part are compared with each other in a sub logical comparison part; and when a disagreement between both the patterns is detected by the main logical comparison part, a main failure signal is generated and written into a main failure analysis memory having the same storage capacity as that of the RAM part. When a disagreement between both the patterns is detected by the sub logical comparison part, a sub failure signal is generated and written into a sub failure analysis memory having the same storage capacity as that of the RAM part. A failure analysis memory, which includes the main and sub failure analysis memories, is provided with a sub address generator for generating a sub address signal that is fed to the sub failure analysis memory. The sub address generator comprises; a plurality of counters; a multiplexer which selects one of those of the plurality of counters which are in their counting state and outputs the count value of the selected counter as the sub address signal to be applied to the sub failure analysis memory; register means for setting data of a value corresponding to the size of the column address of the memory under test; comparison means which compares at least one part of the output data from the multiplexer with at least one part of the data set in the register means and outputs a coincidence signal when coincidence is detected between them; and control means which loads the main address signal in that one of the counters remaining in their non-counting state upon each application of the main address signal, increments the loaded counter upon each sequential output from the SAM part of data corresponding to the main address signal, and responds to the coincidence signal from the comparison means to stop the incrementing of the counter in the counting state and increment that one of the counters having newly set therein the main address signal upon each sequential output of data corresponding to the main address signal from the SAM part.

DESCRIPTION OF THE PREFERRED EMBODIMENTS

Figure 1:
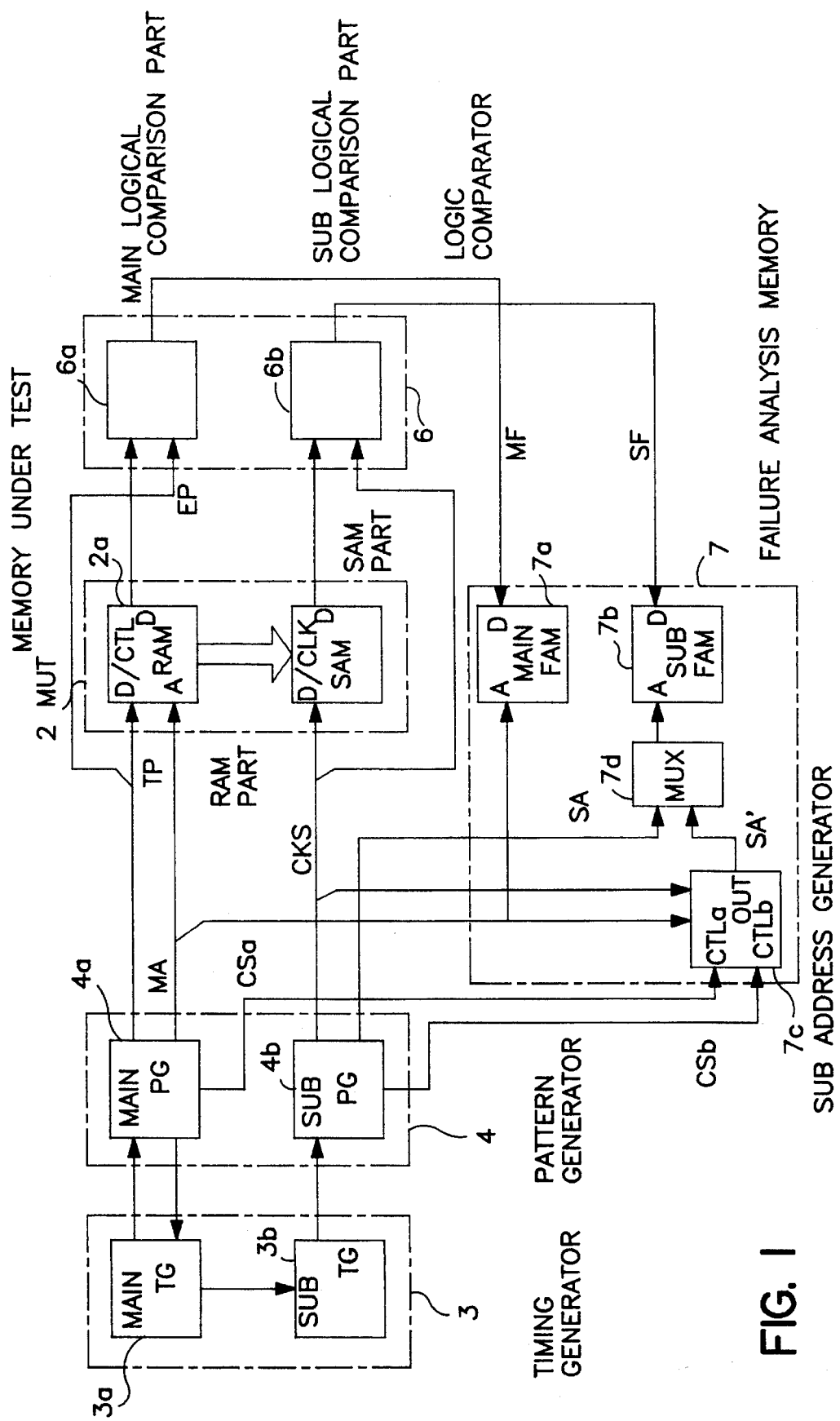
FIG. 1 is a block diagram illustrating an embodiment of the present invention.
Figure 2:
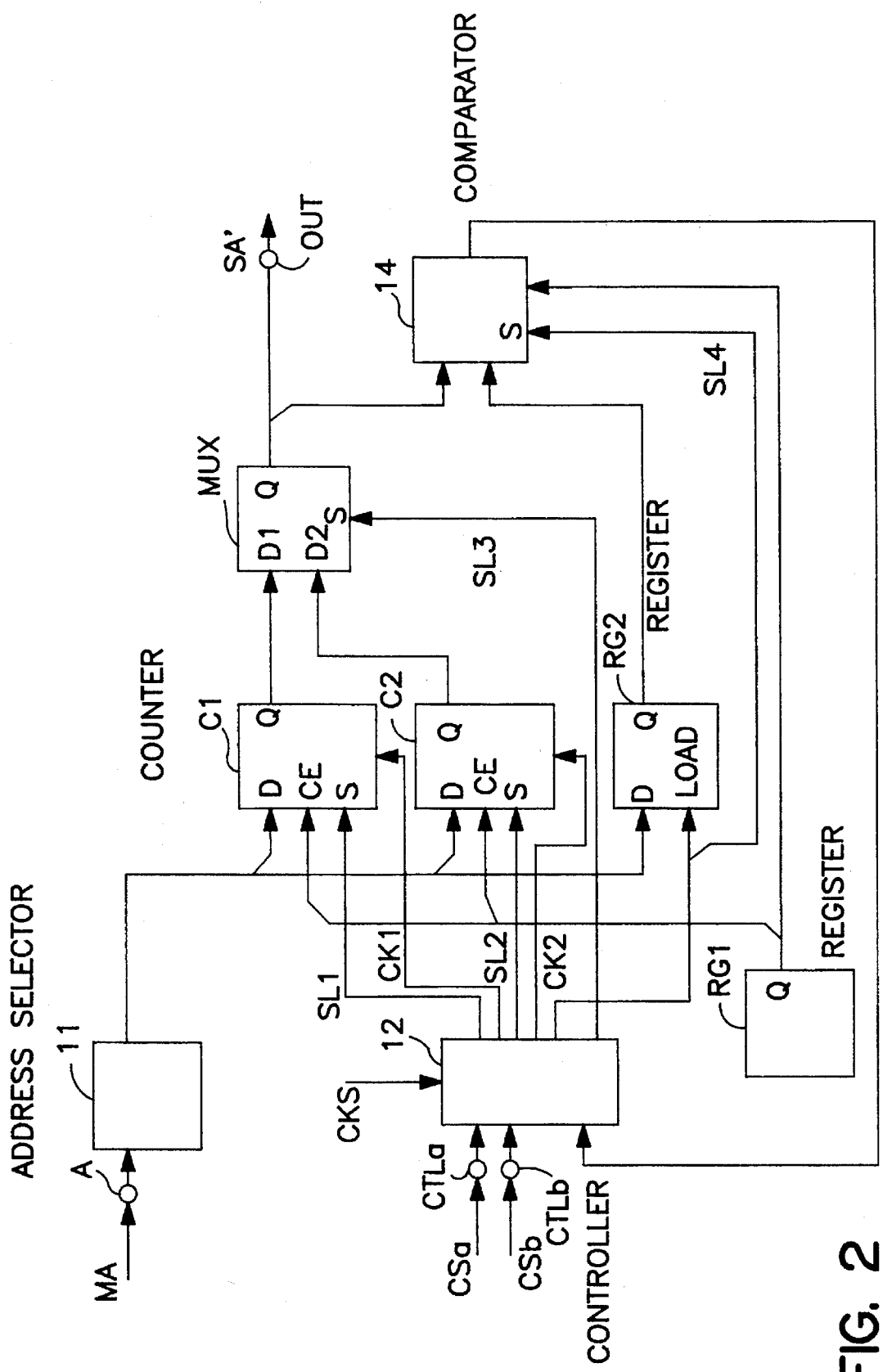
FIG. 2 is a block diagram of a sub address generator in FIG. 1.
Figure 3:
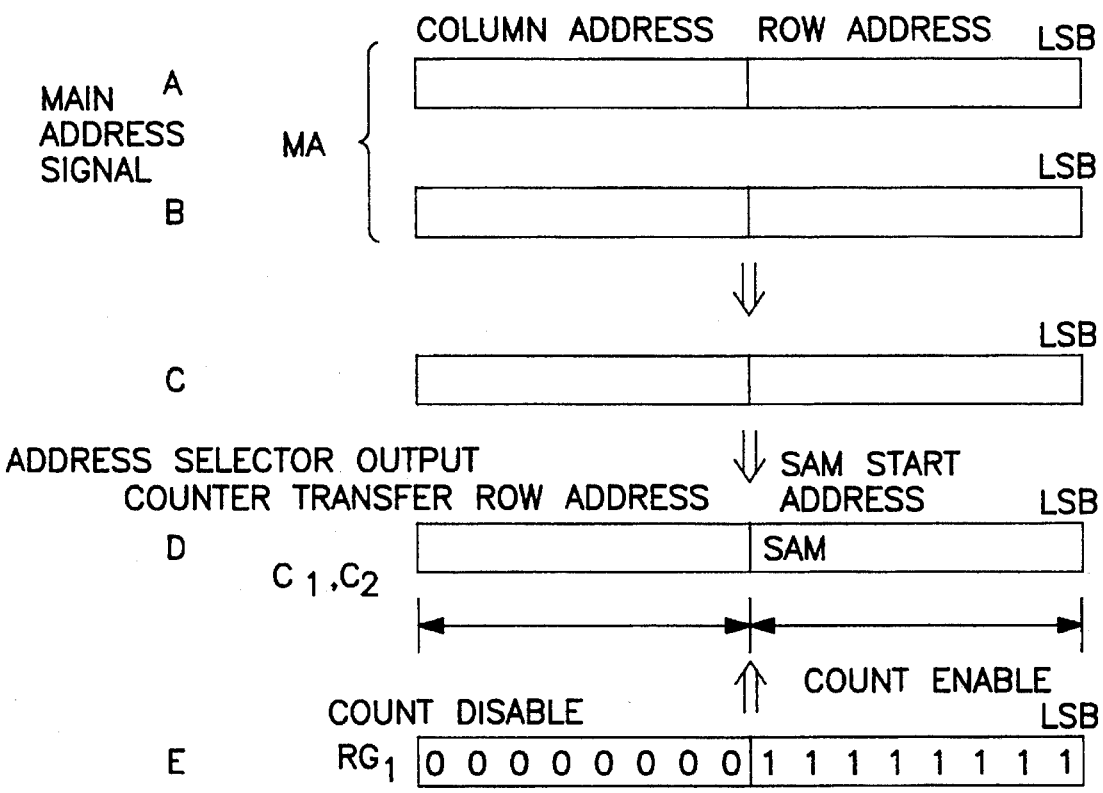
FIG. 3 is a diagram showing the bit configuration of data in the principal part in FIG. 2.
Figure 4:
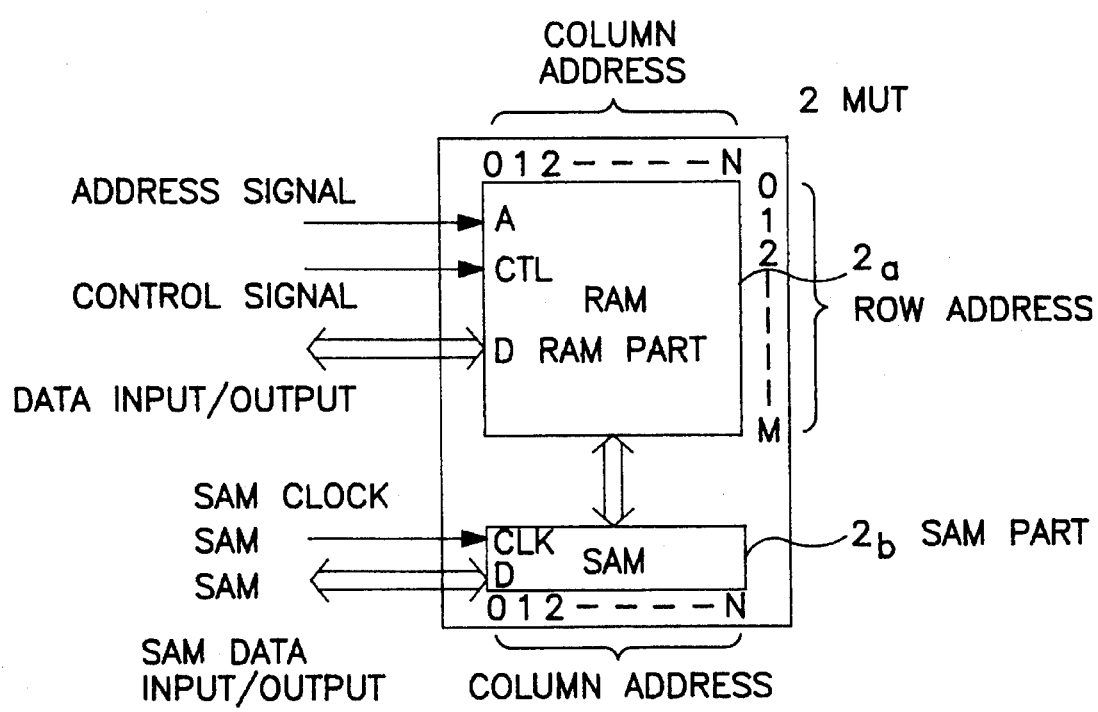
FIG. 4 is a block diagram showing the configuration of a memory under test (MUT).
Figure 5:
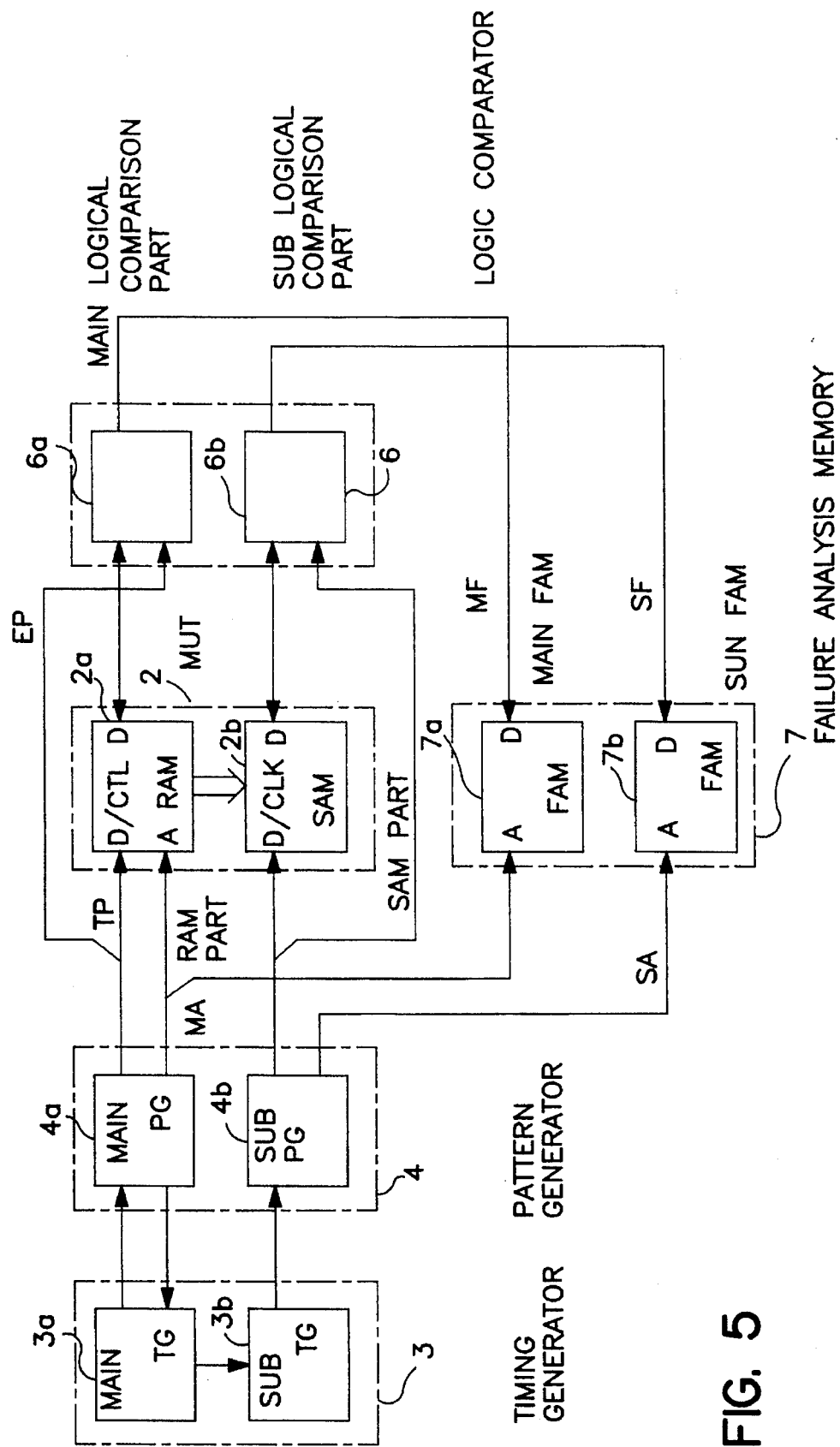
FIG. 5 is a block diagram of a conventional memory testing device.
Figure 6A:
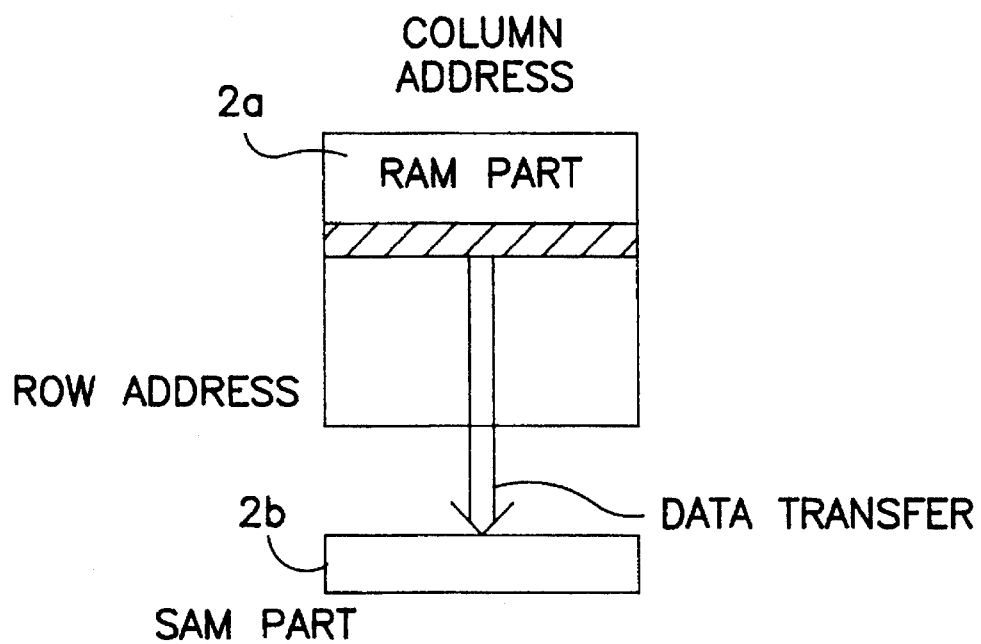
FIG. 6A is a diagram for explaining the read/transfer function of the memory under test.

An embodiment of the present invention will be described with reference to FIGS. 1 through 3, in which the parts corresponding to those in FIGS. 4 and 5 are identified by the same reference numerals and no description will be repeated in respect of them. According to the present invention, a sub address generator 7c is provided in the failure analysis memory 7. In this example there is also provided in the failure analysis memory 7 a multiplexer 7d that selects either one of a sub address signal SA' which is output from the sub address generator 7c and the sub address signal SA which is output from the sub pattern generating part 4b as required. The sub address generator 7c is supplied with the main address signal for the data transfer from the RAM part 2a to the SAM part 2b and a main control signal CSa corresponding to the type of read/transfer from the main pattern generating part 4a. The read/transfer is classified into the simple read/transfer shown in FIG. 6, the split read/transfer in FIG. 7B and the stop control split read/transfer in FIG. 7C. A sub control signal CSb corresponding to a data output instruction to the SAM part 2b is applied from the sub pattern generating part 4b to the sub address generator 7c.

According to the type of the multi-port DRAM which is the memory under test (MUT), the main address signal MA that is applied from the main pattern generating part 4a to an address terminal A of the sub address generator 7c has such a configuration as shown in FIG. 3 Row A which has an 8-bit row address signal, for example, in one half portion at the LSB side and, for example, an 8-bit column (or SAM start address) signal in the other half portion at the MSB side, or such a configuration as shown in FIG. 3 Row B which has the row address singal and the column address signal at positions reverse from those in FIG. 3 Row A. Then, as shown in FIG. 2, the sub address generator 7c is equipped with an address selector 11, which is used, when necessary, to rearrange row and column address signals to bring the latter to the LSB side at all times regardless of the kind of the memory under test, as shown in FIG. 3 Row C.

The main address MA (of 16 bits) that is output from the address selector 11 is loaded into counters C1 and C2 in response to select signals SL1 and SL2, as depicted in FIG. 3 Row D. The counters C1 and C2 operate on the select signals SL1 and SL2 (composed of two bits, for example) that are input thereinto from a controller 12. That is, the select signals SL1 and SL2 are to specify any one of a load mode, an increment mode and a hold mode to the counters C1 and C2. A multiplexer MUX is controlled by a switch signal SL3 from the controller 12 to select the output from either one of the counter C1 and C2 and output as the sub address signal SA'.

The controller 12 is to control respective parts of the sub address generator 7c. In any transfer mode, when the counter C1 (or C2) is in the counting stage (i.e. in the active state), the controller 12 applies the select signal SL2 (or SL1), which indicates the load mode, to the other counter C2 (or C1) in the non-active state to load to load therein the main address, in response to the main control signal CSa corresponding to the transfer instruction from the pattern generating part 4a to the RAM part 2a. Moreover, in any transfer mode the controller 12 provides clock pulses CK1 and CK2 to increment the count values of the counters C1 and C2 from the SAM start address, on the basis of sub the control signal CSb from the sub pattern generating part 4b that corresponds to the data output instruction from the sub pattern generating part 4b to the SAM part 2b. These clock pulses CK1 and CK2 are generated in the controller 12 on on the basis of the clock CKS for data output that is provided from the sub pattern generating part 4b to the SAM part 2b.

A register RG1 is loaded with a count enable signal at the start of the memory test. The register RG1 has a size of, for example, 16 bits equal in number to the bits forming the main address. FIG. 3, Row E shows an example of the count enable data which is set in the register RG1. The maximum value (255=11111111) of the column address of the memory under test is written into the register RG1 over its one half portion (8 bits) at the LSB side and "0's" are written in all of the remaining bits (8 bits) at the MSB side. The enable signal that is loaded into the register RG1 is also applied to the counters C1 and C2, enabling them to count only within the range corresponding to the number of successive bits "1" in the enable signal. A register RG2 is one that sets a stop address corresponding to the stop register control function referred to previously in conjunction with FIG. 7C.

Figure 7A:
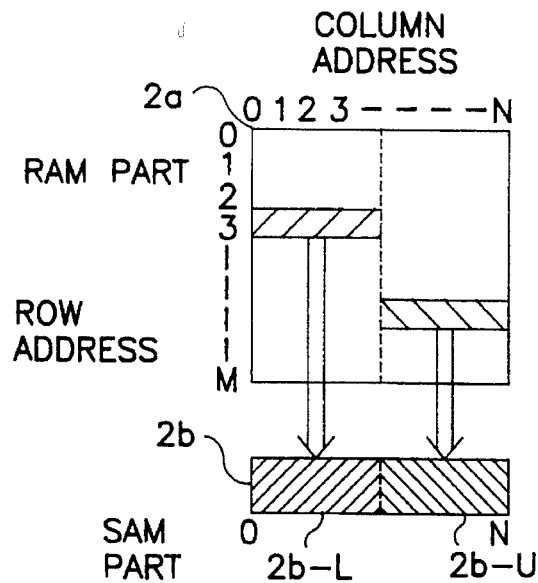
FIG. 7A is a diagram for explaining the split read/transfer function of the memory under test.

A comparator 14 is controlled by a select signal SL4 to select the register RG1 during the simple read/transfer and the split read/transfer and the register RG2 during the stop control split read/transfer and compares the register output with the output from the multiplexer MUX and applies a coincidence signal "1" when coincidence is detected between them. When supplied with the coincidence signal "1" the controller 12 stops the supply of the clock CK1 (or CK2) to the counter C1 (or C2) in the active state but instead starts the supply of the clock CK2 (or CK1) to the counter C2 (or C1) that has remained non-active so far. In the case where the stop address is set in the register RG2 and data is being transferred from the RAM part 2a to the non-active side of the SAM part 2b, the register RG2 is selected (see FIG. 7). In the case of the split read/transfer, the comparator 14 needs to detect column address values AM1="01111111" and AM2="11111111" which are maximum addresses of lower and upper address areas into which the entire column address area is divided; but it is not necessary to discriminate whether each of them is the maximum value in the upper or lower address area. Then, the comparator 14 is supplied with the lower 8-bit output of the 16-bit one from the register RG1, but with the least significant bit removed or substituted with a "0," that is, "01111111". The detection of coincidence by the comparator 14 takes place only within the range of a succession of bits "1" of the data set in the register RG1 or RG2. Since data including a desired number of successive bits "1" can be set in the register RG1 in accordance with the word length of the SAM part, it is possible to test, without nay trouble, MUT's different in the size (or word length) of the SAM part 2b, in combination of a formatting function of the address selector.

(A) Simple Read/Transfer Test

When supplied with a transfer instruction from the main pattern generating part 4a after being supplied therefrom with the main address MA composed of the row address and the column address (the SAM start address), the RAM part 2a provides the SAM start address to the SAM part 2b and at the same time reads out all pieces of data from the row address and then transfers them to the SAM part 2b. On the other hand, the same main address MA is loaded into one of the counters, for example, C1 under control of the select signal SL1.

Figure 6B:
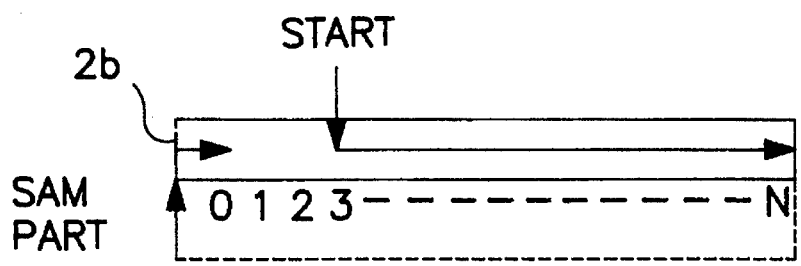
FIG. 6B is a diagram for explaining the data output operation of the SAM part in a simple read/transfer mode.

As data is output from the SAM part 2b of the MUT 2 upon each occurrence of the clock CKS, the counter C1 counts the clock CK1 synchronized with the clock CKS and is incremented from the SAM start address, as shown in FIG. 6B. Yet the counter C1 is enabled primarily for the increment operation only over the 8-bit range at the LSB side that corresponds to the range over which bits "1" are set in the register RG1, and the transfer row address (8 bits) at the MSB side set in the counter C1 will remain unchanged. The multiplexer MUX is controlled by the select signal SL3 to always select and output the count value of that one of the counters which is in the counting state (i.e. in the active state). The output from the multiplexer MUX is output as the sub address SA' composed of a set of the transfer row address and the column address.

In the case of operating the MUT in the simple read/ transfer mode, the controller 12 switches the counter C1 to the no-active state and the counter C2 to the active state regardless of the output from the comparator 14 in response to the control instruction CSb that the sub pattern generating part 4b generates immediately prior to the start of data output from the SAM part 2a. Then, the supply of the clock CKS to the SAM part 2b is initiated and at the same time the controller 12 provides the clock CK2 to the counter C2 to start its increment and responds to the next row address data transfer instruction to load its main address MA into the counter C1, performing the same operation. In this way, the counters C1 and C2 alternately provides a series of sets of the transfer row address and the column address via the multiplexer MUX to a data output terminal OUT, as the sub address signal SA' that is to be applied to the sub failure analysis memory 7b in the read/transfer test. Incidentally, in the simple read/transfer operation the data transfer and the data output from the SAM part 2b are alternately performed with different cycles; hence, it is apparent that only one of the cunters C1 and C2 can be controlled by the controller 12 to generate the sub address. The counters C1 and C2 may be also be switched in response to the coincidence signal from the comparator 14.

(B) Split Read/Transfer Test

Figure 7B:
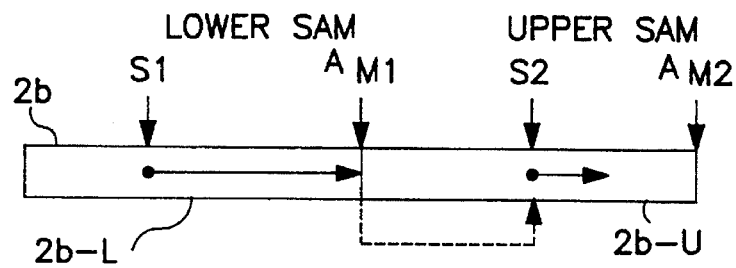
FIG. 7B is a diagram for explaining the data output operation of the SAM part in a split read/transfer mode.

In the case of operating in the split read/transfer mode (FIG. 7A) the MUT which is a multi-port DRAM, data at each transfer row address of the RAM part 2a is divided into two areas, i.e. the lower area 0 to 127 and the upper area 128 to 255 of the entire column address area, which are separately transferred to the lowr address area SAM2b-L and the upper address area SAM2b-U. As shown in FIG. 7B, pieces of data from the SAM start address S1 to the address 127 in the lower address area SAM2b-L are sequentially output, after which pieces of data from the SAM start address S2 to the address 255 in the upper address area SAM2b-U are sequentially output. This is repeated for each row address.

Figure 8:
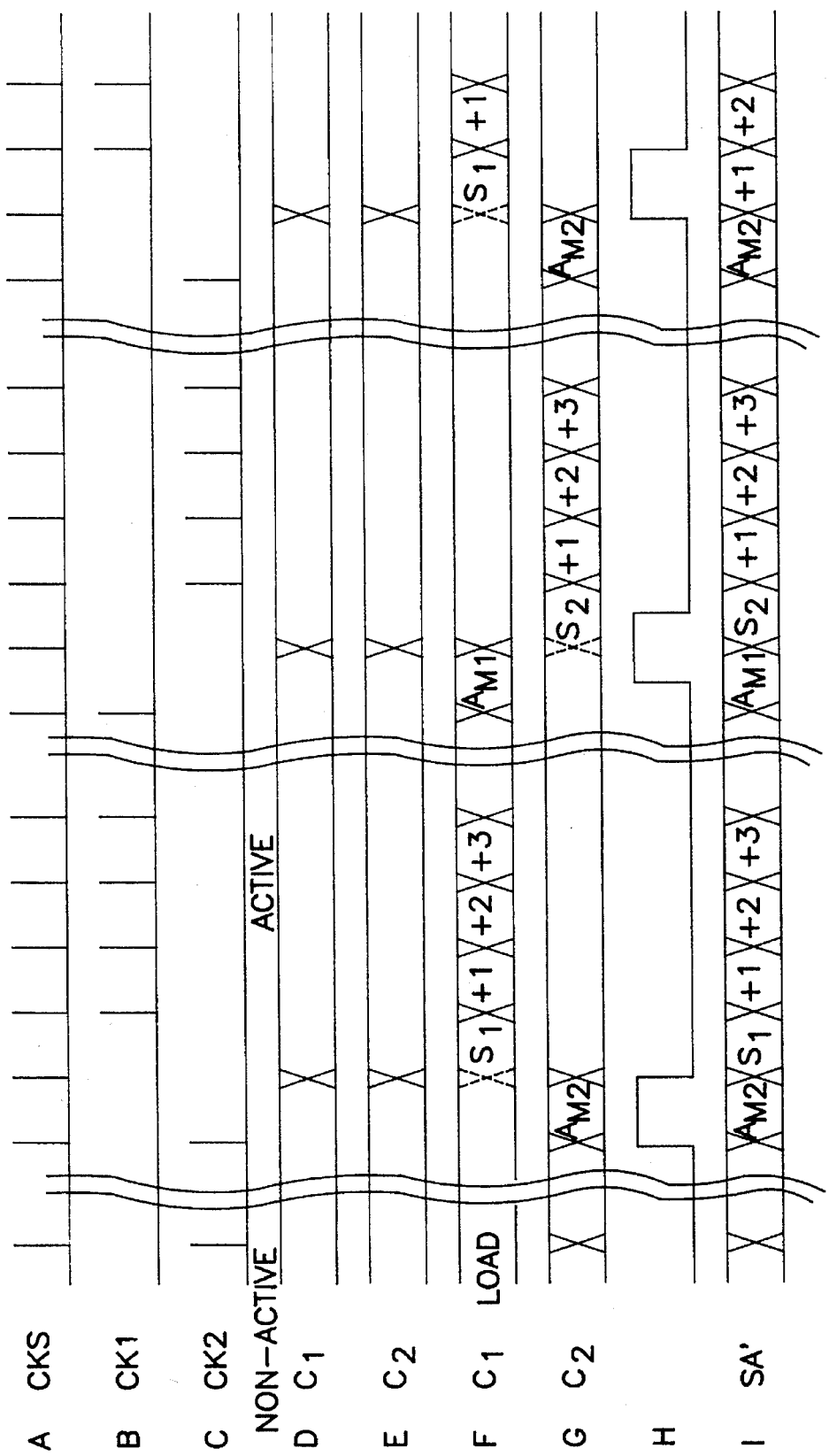
FIG. 8 is a timing chart for explaining a sub address generating operation during the split read/transfer.

When the main pattern generating part 4a supplies the RAM part 2a with the main address signal MA composed of a set of an S-bit transfer row address R and an 8-bit SAM start address S1 (which set will hereinafter be identified by RS1) and then with a transfer instruction, the whole data specified by the row address R and the lower column address area 0 through 127 indicated by the most significant bit, for example, "0" of the SAM start address S1 is transferred at one time from the RAM part 2a to the lower address area SAM2b-L. On the other hand, in response to the main control signal CSa corresponding to above-metnioned transfer instruction the controller 12 loads the main address MA=RS1 into that one of the counters C1 and C2 which is not in one of the states shown in Rows D and E of FIG. 8 (C1, for example, as shown in FIG. 8, Row F). In FIG. 8, Rows E, F and I the row address R is omitted and only the column address is shown.

Next, the SAM part 2b responds to the clock CKS (FIG. 8 Row A) from the sub pattern generating part 4b to sequentially output the transferred data from the SAM start address S1 to the maximum address AM1=127 in the lower address area. At this time the controller 12 applies the clock CK1 (Row B), in synchronization with the clock CKS, to the counter C1 loaded with the main address MA, sequentially incrementing it from the SAM start address S1 as depicted in FIG. 8, Row F. Hence, the count value output from the counter C1 (which value includes the transfer row address set therein) is indicative of the original address in the RAM 2a where the data being currently output from the SAM part 2b was stored, and the count value output is provided as the sub address SA' (Row I) from the multiplexer MUX. When the main pattern generating part supplies the RAM part 2a with the main address signal MA composed of a set of a row address R and a SAM start address S2 and then with a transfer instruction while data is thus sequentially output from the lower address area SAM2b-L, the RAM 2a similarly transfers at one time to the upper address area SAM2b-U all the data specified by the row address R and the upper column address area 128 through 255 indicated by the most significant bit "1" of the SAM start address S2. In response to the main control signal CSa corresponding to the transfer instruction the controller 12 loads the main address signal MA=RS2 into the counter C2 that is not performing the counting operation, as shown in FIG. 8, Rows E and G. When the lower 7-bit value of the count value of the counter C1 reaches the value 127 expressed by the lower 8 bits, except the most significant bit, of the enable data set in the register RG1, that is, the maximum address AM1 in the lower address area, the comparator 14 yields the coincidence signal "1" as depicted in FIG. 8, Row H and the controller 12 responds to the coincidence signal to switch t the states of the counters C1 and C2 as shown in FIG. 8, Rows D and E.

Next, the SAM part 2b sequentially outputs the transferred data from the start address S2 to the maximum address AM2=255 in the upper address area in accordance with the clock CK2. Simultaneously with this, the controller 12 provides the clock CK2 (Row C), in synchronization with the clock CKS, to the counter C2 loaded with the main address MA=RS2, incrementing it one by one from the start address S2 to the address AM2=255 at which the comparator 14 outputs the coincidence signal (Row G). The count value of the counter C2 is provided as the sub address SA' via the multiplexer MUX (Row I). In this while, the main pattern generating part 4a updates the row address R (R←R+1 on a stepwise basis, for example) and, as in the above, provides the main address MA=RS1 to the RAM part 2a to cause it to transfer data from the column address area 0 through 127 at the new row address R to the lower address area SAM2b-L, while at the same time the main address MA=RS1 is loaded into the counter C1 by the select signal SL1 from the controller 12.

In this way, data is transferred from the RAM part 2a to one of the lower address area SAM2b-L and the upper address area SAM2b-U and the main address including the SAM start address is loaded into one of the counters C1 and C2. In this while, the other of the lower address are SAM2b-L and the upper address area SAM2b-U outputs the data already transferred thereto and the other of the counters C1 and C2 is incremented one by one from the start address and outputs the sub address SA'. These operations are performed in parallel at the lower and upper sides alternately with each other.

(c) Stop Control Split Read/Transfer

Figure 7C:
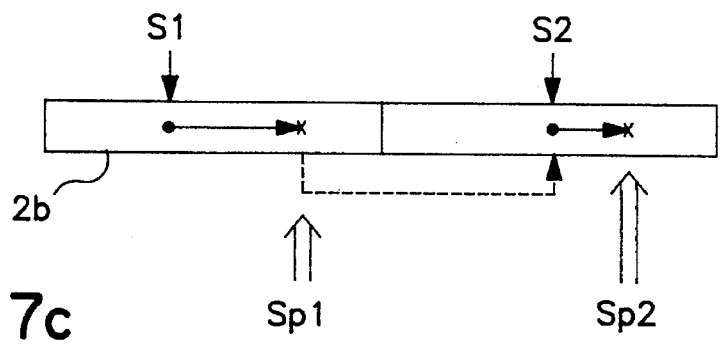
FIG. 7C is a diagram for explaining the data output operation of the SAM part in a stop control split read/transfer mode.

This transfer operation is basically the same as the above-described split read/transfer operation, and the main address MA containing the SAM start address S1 (or S2) is loaded into the counter C1 (or C2) so as to start the data output from the lower area SAM2b-L (or upper address area SAM2b-U) at the start address S1 (or S2) as shown in FIG. 7C. This transfer operation differs from the split read/transfer operation in that the counters are not incremented up to the maximum addresses, for example, 127 and 255, in the lower and upper address areas but instead the active and nonactive states of the counters are switched at desired addresses (stop addresses set in the register RG2) Sp1 and Sp2. In the embodiment of FIG. 2, however, since the comparator 14 is enabled for comparison only within the range defined by a succession of bits "1" in the data provided from the registers RG1 and RG2, the stop addresses in the lower and upper address areas need to be set to values that are expressed by $2^m-1$ and $2^n-1$ (where m and n are integers greater than 0 but smaller than 7), respectively, but the comparator 14 can easily be configured for comparison using an arbitrary value in the range of from 0 to 127.

Eight-bit stop address data, generated as the main address signal MA by the main pattern generating part 4a, is loaded into the register RG2 with a desired main address generation cycle. In the comparator 14 the output from the register RG2 is selected by the select signal SL4 and is compared with the count value of the counter C1 or C2 which is being incremented. When coincidence is detected in the comparator 14, the controller 12 switches the counter selecting operation of the multiplexer MUX to jump to the start address S2 (or S1) in the opposite address area and at the same time provides the clock CK2 (or CK1) to the selected counter C2 (or C1). The output from the counter C2 (or C1) selected by the multiplexer MUX is provided as the sub address SA'. The other operations are basically the same as those of the afore-mentioned split read/transfer operation, and hence will not be described.

While in the above the simple read/transfer, the split read/transfer and the stop control split read/transfer have been described separately, an arbitrary transfer mode can be switched to another transfer mode, during the test of the MUT, simply by changing the data that is loaded into each of the counters C1 and C2 and the register RG2.

As described above, in the prior art the sub address signal SA that is provided to the failure analysis memory 7b is obtained from the sub pattern generating part 4b under program control, whereas the present invention permits the generation of the sub address signal SA' through hardware by supplying the sub address generator 7c with the main address signal MA and the main control signal CSa from the main pattern generating part 4a and the sub control signal CSb from the sub pattern generating part 4b. Thus, the present invention solves the afore-mentioned problems of the prior art such as heavy workload for programming and implementation of complex and hence difficult-to-generate programs.

I claim:

1. A memory testing device for testing a memory device having a random access memory (RAM) part and a serial or sequential access memory (SAM) part, comprising:

timing generator means for generating and providing a timing signal;

a main pattern generating part, receiving said timing signal from said timing generator means, for applying a test pattern, a control signal and a main address signal to the RAM part of the memory device under test and outputting an expected pattern;

a sub pattern generating part, receiving said timing signal from said timing generator means, for applying a test pattern and a clock signal to the SAM part of the memory device under test and outputting an expected pattern;

the SAM part having data corresponding to said main address signal transferred from the RAM part and stored therein:

a main logical comparison part, receiving the test pattern read out of the RAM part and the expected pattern supplied from said main pattern generating part, for comparing both the test pattern and the expected pattern with each other and generating a main failure signal when a disagreement between both the test pattern and the expected pattern is detected by said main logical comparison part;

a sub logical comparison part, receiving the test pattern read out of the SAM part and the expected pattern output from said sub pattern generating part, for comparing both the test pattern and the expected pattern with each other and generating a sub failure signal when a disagreement between both the test pattern and the expected pattern is detected by said sub logical comparison part;

a failure analysis memory comprising:
a main failure analysis memory having the same storage capacity as that of the RAM part; and
a sub failure analysis memory having the same storage capacity as that of the RAM part, said main failure signal output from said main logical comparison part being written into said main failure analysis memory, said sub failure signal output from said sub logical comparison part being written into said sub failure analysis memory; and a sub address generator provided in said failure analysis memory for generating a sub address signal that is applied to said sub failure analysis memory, said sub address generator comprising:
a plurality of counters;
a multiplexer for selecting one of said plurality of counters which is in a counting state and outputting the count value of said selected counter as a sub address signal that is input to said sub failure analysis memory;
register means for setting data of a value corresponding to a number of column addresses of said memory device under test;
comparator means for comparing at least one part of the count value of said multiplexer with at least one part of said data set in said register means and outputting a coincidence signal when coincidence is detected between them; and
control means for loading said main address signal into one of said plurality of counters in response to said coincide signal which is in a non-counting state upon each application of said main address signal thereby changing said one of said plurality of counters, into which said main address signal has been loaded, from a non-counting state thereof to a counting state thereof, incrementing said main address-loaded counter which is now in a counting state each time data corresponding to said main address signal is sequentially output from the SAM part, responding to said coincidence signal from said comparator means for stopping incrementing said one of said plurality of counters in said counting state thereby changing said one of said plurality of counters from a counting state thereof to a non-counting state thereof as well as changing said one of said plurality of counters, into which said main address signal has been loaded, from a non-counting state thereof to a counting state thereof, and incrementing said main address-loaded counter which counting state has been newly changed each time data corresponding to said main address signal is sequentially output from the SAM part.

2. The memory testing device according to claim 1, wherein said sub failure analysis memory further comprises a stop address register, receiving a stop address generated by said main pattern generating part as said main address signal, for storing said stop address therein, and wherein said comparator means is controlled by said control means to select the stop address read out of said stop address register when said SAM part is outputting data transferred thereto in a stop control split read/transfer mode, and compares said stop address with at least one part of the output from said multiplexer, and outputs said coincidence signal upon detection of coincidence therebetween.

3. The memory testing device according to claim 2, wherein said sub failure analysis memory further comprises an address selector to which said main address signal, composed of a transfer row address of said RAM part and a start address of said SAM part, is supplied from said main pattern generating part, said address selector outputting said transfer row address and said start address input thereinto in a predetermined sequence to one of said plurality of counters.

4. The memory testing device according to claim 2, wherein each of said plurality of counters is a counter which receives the set value of said register means as an enable data and is enabled for counting within a range of successive "1" bits of said enable data, said enable data containing at its least significant bit side bits "1", the number of which is equal to the number of addresses of said column address of said memory under test.

5. The memory testing device according to claim 1, wherein said sub failure analysis memory further comprises an address selector to which said main address signal, composed of a transfer row address of said RAM part and a start address of said SAM part, is supplied from said main pattern generating part, said address selector outputting said transfer row address and said start address input thereinto in a predetermined sequence to one of said plurality of counters.

6. The memory testing device according to claim 1, wherein each of said plurality of counters is a counter which receives the set value of said register means as an enable data and is enabled for counting within a range of successive "1" bits of said enable data, said enable data containing at its least significant bit side bits "1", the number of which is equal to the number of addresses of said column address of said memory under test.

* * * * *

UNITED STATES PATENT AND TRADEMARK OFFICE
CERTIFICATE OF CORRECTION

PATENT NO. : 5,481,671

DATED : January 2, 1996

INVENTOR(S) : Kenichi FUJISAKI

It is certified that error appears in the above-indentified patent and that said Letters Patent is hereby corrected as shown below:

Column 3, line 5, delete "white" and insert –while–; and line 53, after "part" insert –when a disagreement between both the patterns is detected by the sub logical comparison part, a sub failure signal is generated and written into a sub failure analysis memory having the same storage capacity as that of the RAM part–.

Column 10, line 18, delete "coincide" and insert –coincidence–; and lines 52 and 61, delete "2" and insert –1–.

Column 11, line 2, delete "1" and insert –2– therein.

UNITED STATES PATENT AND TRADEMARK OFFICE
CERTIFICATE OF CORRECTION

PATENT NO. : 5,481,671
DATED : January 2, 1996
INVENTOR(S) : Kenichi Fujisaki

It is certified that error appears in the above-indentified patent and that said Letters Patent is hereby corrected as shown below:

Column 12, line 1, delete "1" and insert -2- therein.

Signed and Sealed this

Ninth Day of April, 1996

Attest:

BRUCE LEHMAN

*Attesting Officer*  *Commissioner of Patents and Trademarks*